US009343177B2

(12) United States Patent
Malone

(10) Patent No.: US 9,343,177 B2
(45) Date of Patent: May 17, 2016

(54) ACCESSING CONTROL REGISTERS OVER A DATA BUS

(71) Applicant: Apple Inc., Cupertino, CA (US)

(72) Inventor: Michael Ross Malone, San Jose, CA (US)

(73) Assignee: Apple Inc., Cupertino, CA (US)

( * ) Notice: Subject to any disclaimer, the term of this patent is extended or adjusted under 35 U.S.C. 154(b) by 387 days.

(21) Appl. No.: 13/757,498

(22) Filed: Feb. 1, 2013

(65) Prior Publication Data
US 2014/0223090 A1 Aug. 7, 2014

(51) Int. Cl.
*G11C 19/00* (2006.01)
*G06F 13/00* (2006.01)

(52) U.S. Cl.
CPC ............... *G11C 19/00* (2013.01); *G06F 13/00* (2013.01)

(58) Field of Classification Search
USPC .......................................................... 711/104
See application file for complete search history.

(56) References Cited

U.S. PATENT DOCUMENTS

| | | | |
|---|---|---|---|
| 5,327,159 A * | 7/1994 | Van Aken et al. | 345/593 |
| 6,119,204 A * | 9/2000 | Chang et al. | 711/141 |
| 6,658,169 B1 * | 12/2003 | Wober et al. | 382/307 |
| 7,218,340 B2 * | 5/2007 | Takahashi et al. | 348/65 |
| 7,526,593 B2 | 4/2009 | Mandal et al. | |
| 7,934,044 B2 | 4/2011 | Chun-Ting et al. | |
| 2004/0054867 A1 * | 3/2004 | Stravers et al. | 711/207 |
| 2005/0005039 A1 | 1/2005 | Saito | |
| 2010/0141664 A1 * | 6/2010 | Rawson et al. | 345/502 |
| 2010/0332790 A1 * | 12/2010 | Maruyama | 711/207 |
| 2011/0161620 A1 | 6/2011 | Kaminski et al. | |

OTHER PUBLICATIONS

Author Unknown, "UM10204: I²C-bus specification and user manual," NXP B.V., 64 pages, Feb. 13, 2012.

* cited by examiner

*Primary Examiner* — Jared Rutz
*Assistant Examiner* — Hamdy S Ahmed
(74) *Attorney, Agent, or Firm* — Brownstein Hyatt Farber Schreck, LLP

(57) ABSTRACT

An electronic apparatus that includes a controlled device with a plurality of control registers. A data bus is coupled between the controlled device and a processor, and an interface is configured to receive a plurality of portions of data read from or to be written to the plurality of control registers. The electronic apparatus also includes a correlation circuit configured to associate at least some of the plurality of portions of data with respective physical addresses of the plurality of control registers based on respective positions of the respective portions of data within the plurality.

20 Claims, 7 Drawing Sheets

ACCESSING CONTROL REGISTERS OVER A DATA BUS

TECHNICAL FIELD

The present invention relates generally to computing devices, and more specifically, to accessing control registers of an image sensor over a data bus.

BACKGROUND

Many electronic apparatuses (e.g., digital cameras, cell phones, smart phones, tablet computers, laptop computers, digital music players, portable gaming stations, etc.) include one or more data buses over which a main or central processor circuit communicates with one or more controlled devices. For example, a main processor circuit may be coupled to an image sensor in a digital camera through a data bus. The main processor circuit may send commands and data over the data bus, and may also receive responses and data back from the image sensor over the data bus. Designing an appropriate data bus can be challenging because while it is typically desirable to have a large data throughput available on the data bus, it can also be desirable to have a relatively narrow (e.g., few data lines) data bus to conserve physical space within an electronic apparatus and/or to reduce noise, interference, cross-coupling, and other issues involved with wide, parallel data buses. The need for a narrow data bus is particularly acute in view of today's shrinking electronic apparatus sizes. Several industry standards and protocols exist for data buses in electronic apparatuses today, and an electronic apparatus designer may find it useful to use such standards rather than design a customized data bus. These industry standards, however, are typically constrained by legacy requirements, and hence are typically relatively slow.

Taking an image sensor as one example of a controlled device connected to a data bus, some examples of industry protocols for serial data buses for image sensors include Inter-Integrated Circuit (I2C), the Camera Control Interface (CCI) of MIPI, the Standard Mobile Imaging Architecture (SMIA), and so forth. Using a serial (or even a parallel) data bus can prove challenging for controlling an image sensor if, for example, the image sensor has control registers that need to be rapidly updated over the data bus. Such a scenario may occur where one or more of the auto-exposure, shutter speed, white balance, analog-to-digital gain, gamma, saturation, hue, resolution, and so forth for one or more pixels of the image sensor need to be updated in between or during each frame. As the frame rate is increased, the amount of time available for both communicating such updates over the data bus and for actually updating the control registers and relevant circuitry of the control circuit decrease. Today's image sensors not only typically have very high frame rates (for example between 30 and 60 fps), but the image sensors are becoming more complex with more control registers that need to be updated. The combination of reduced time available to communicate control register updates over a data bus and the increased number of control register updates to communicate over the data bus can overload a relatively slow data bus.

SUMMARY

One example of the present disclosure may take the form of an electronic apparatus that includes a controlled device with a plurality of control registers. A data bus is coupled between the controlled device and a processor, and an interface is configured to receive a plurality of portions of data read from or to be written to the plurality of control registers. The electronic apparatus also includes a correlation circuit configured to associate at least some of the plurality of portions of data with respective physical addresses of the plurality of control registers based on respective positions of the respective portions of data within the plurality.

Another example of the disclosure may take the form of an image sensor with a plurality of control registers. An input interface is configured to receive a plurality of portions of data to be written to the plurality of control registers, and a correlation circuit is configured to associate at least one portion of data with a respective physical address of one of the plurality of control registers based on a position of the at least one portion of data within the plurality.

Another example of the present disclosure may take the form of a method for accessing control registers of an image sensor. A plurality of portions of data to be written to a plurality of control registers of the image sensor may be received as a group, and respective portions of data may be associated with respective physical addresses of the plurality of control registers based on positions of the respective portions of data within the received group. Respective portions of data may be written to respective control registers based on respective physical addressees of the plurality of control registers associated with the respective portions of data.

SPECIFICATION

Overview

In some embodiments herein, apparatuses and methods for accessing control registers over a data bus of an electronic device are disclosed. In one embodiment, the electronic device may take the form of a smart phone or tablet computer that includes a camera. The camera includes an image sensor that is controlled by a main processor circuit of the device over a data bus. The main processor circuit may need to access (e.g., read from and/or write to) the control registers of the image sensor rather frequently, and may have relatively little time to do so. Accordingly, the apparatuses and methods disclosed herein may enable the main processor circuit to efficiently access the control registers of the image sensor by remapping physical control register addresses with virtual register addresses according to a correlation circuit. The virtual register addresses may allow for data to be read from or written to the corresponding physical control registers to be more efficiently communicated across the data bus coupled between the main processor circuit and the image sensor.

Figure 1:
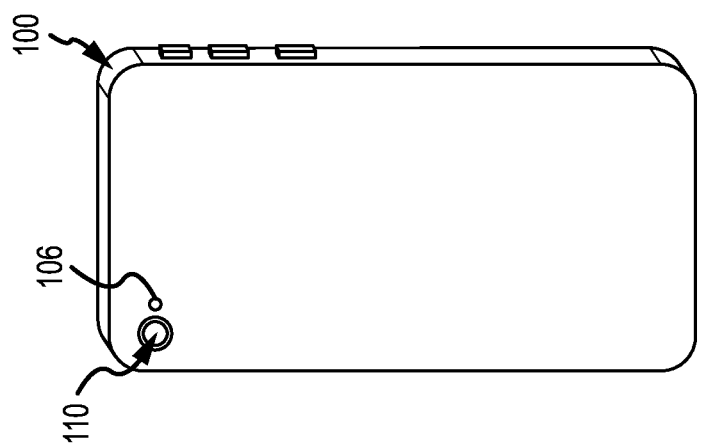
FIG. 1 is a perspective view of an electronic apparatus including an image sensor.

Turning now to the figures, an electronic apparatus including a data bus and one or more devices controlled over the data bus by a main processor circuit will be discussed in more detail. FIG. 1 is a perspective view of an electronic apparatus 100 including, among other things, an image sensor 110 and a flash 106. The electronic apparatus 100 may be substantially any type of device and may include a digital camera, a cell phone, a smart phone, a tablet computer, a laptop computer, a digital music player, a portable gaming station and so forth. The electronic device 102 may include a display 103 such as a touch screen (not shown in FIG. 1), an enclosure, and/or one or more input buttons and receiving ports.

Figure 2:
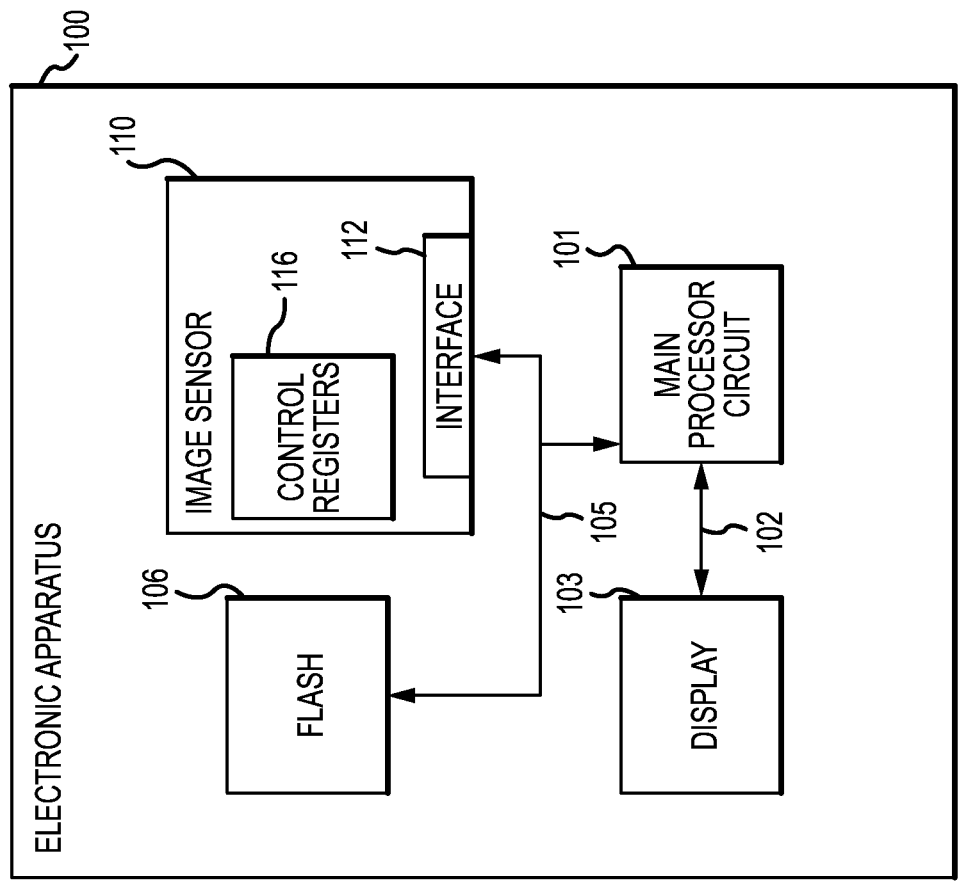
FIG. 2 is a block diagram of the electronic apparatus of FIG. 1.

Turning now to FIG. 2, a block diagram of the electronic apparatus 100 of FIG. 1 is shown, illustrating one embodiment of the present disclosure. As mentioned above, the electronic apparatus 100 may include an image sensor 110. The image sensor 110 may be a complementary metal-oxide-semiconductor (CMOS) image sensor, a charge-coupled-device (CCD) image sensor, or generally any type of image sensor.

The electronic apparatus 100 may include a main processor circuit 101 that controls the operation of the electronic apparatus 100, including the image sensor 110. The main processor circuit 101 may be coupled to and may control the display 103 over a bus 102, may provide visual data to the display 103, and if the display 103 is a touch-screen, the display 103 may also provide input data to the main processor circuit 101 over the bus 102.

The electronic apparatus 100 may also include one or more controlled devices such as a flash 106 and an image sensor 110. These controlled devices may be coupled to the main processor circuit 101 through a common data bus 105 in some examples. Other components (not shown) may also be coupled to the main processor circuit 101 through the same, common data bus 105. One, two, three, or generally any number of controlled devices may be coupled to the main processor circuit 101 through the data bus 105.

In some examples, the data bus 105 may be a one way bus—i.e., the main processor circuit 101 may provide commands and/or data to the bus 105 and the controlled devices may receive the commands and/or data places on the bus but may not be able to provide commands and/or data to the bus 105 themselves. In other examples, and as illustrated in FIG. 2, the data bus 105 may be bidirectional, and both the main processor circuit 101 as well as controlled devices such as the flash 106 and the image sensor 110 may both provide and receive commands and/or data on the data bus 105. The bus may be implemented using the I2C protocol in some examples, and/or using the CCI/MIPI, or SMIA protocols.

For a data bus 105 that implements the I2C protocol, the data bus 105 may include a serial data line (SDA) and a serial clock line (SCL). The serial data line may be a single bit wide, and the I2C protocol may specify a relatively slow operating frequency, such as 400 khz. The I2C protocol may dictate the format, content, and structure of requests to write to and read from the control registers 116 (described below) of the image sensor 110 over the data bus 105, as well as various other commands to other devices coupled to the data bus 105. For example, the I2C protocol may provide that control registers 116 with sequential addresses can be read from or written to in a burst-type mode, as explained in more detail below.

Of course the data bus 105 need not implement the I2C protocol, and need not be serial (e.g., one bit wide), but may instead be any type of serial or parallel data bus.

The image sensor 110 includes control registers 116 which control at least in part the functionality of the image sensor 110. The control registers 116 may control one or more of the auto-exposure, shutter speed, white balance, analog-to-digital gain, gamma, saturation, hue, resolution, and so forth for one or more pixels of the image sensor 110 or the image sensor 110 as a whole. In some cases, it may be possible to update some of these registers 116 in between or even during the integration of individual frames of the image sensor 110. The registers 116 may be updated by writing different values of data to them. For example, one of the control registers 116 may be one byte (8 bits) wide, and the data stored in the register may determine the white balance correction for the image sensor, with for example the value of 00000000 indicating no white balance correction, and a value of 11111111 indicating the maximum white balance correction. In some embodiments, the control registers 116 may be physical registers, implemented for example as flip-flops or other storage gates. In other embodiments, the control registers 116 may be implemented in a memory array, a processor cache, or in any suitable architecture that allows for control of the image sensor 110 through received commands or updates.

The image sensor 110 also may include an interface 112, such as an input interface or an input/output (I/O) interface, one embodiment of which is explained in more detail below with reference to FIG. 4. Although not illustrated in FIG. 2, the electronic apparatus 100 may further include one or more other components, including input dials or buttons, speakers, microphones, radios and antennas, graphics processors, memory, a battery or other power source, sensors such as an accelerometer, magnetometer, and so forth.

Figure 3:
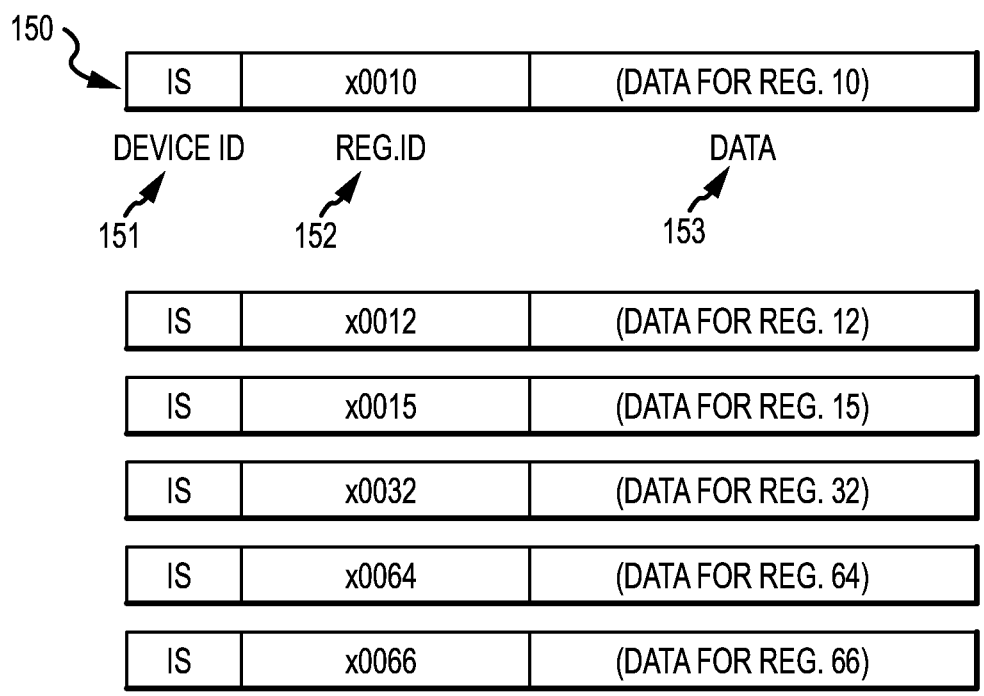
FIG. 3 is an illustration of a series of write commands sent to an image sensor over a data bus according to the prior art.

FIG. 3 is a simplified illustration of how a series of write command transactions may be sent to the image sensor 110 over the data bus 105 according to the prior art. In FIG. 3, six different portions of data are to be written to six non-sequentially addressed control registers 116 (specifically to registers x0010, x0012, x0015, x0032, x0064, and x0066). Because the control registers 116 to which the plurality of portions of data are to be written to do not have sequential, monotonically incrementing numerical addresses, the I2C protocol (or other protocol implemented on the data bus 105) may require that a separate header be sent for each portion of data, thus requiring each portion of data to be transmitted over data bus 105 as a separate transaction. For example, for the data to be written to control register with address x0010, the data bus 105 protocol may require each write transaction 150 to include a slave device identification or address 151 and a control register identification or address 152 (together forming a header), followed by one or more bits or bytes of data 153 to be written to the specified control register in the specified slave device. The protocol may also require other fields to be transmitted as part of the transaction 150, including a read/write bit, a start bit, a stop bit, error correction code bits, an offset bit, numerical constant bits, and so forth, but for clarity only the device ID 151, register ID 152, and data 153 fields are illustrated in FIG. 3.

After the first transaction 150 writing data to the register at address x0010 is complete, a separate transaction, with a separate header, may be provided in order to write data to the register at address x0012. The separate transaction may include similar fields as the first except of course the register ID field 152 is provided as x0012, and the data field 153 is provided as the data that is to be written to that respective control register. Similarly, third, fourth, fifth, and sixth transactions may be provided in order to write data to the registers at addresses x0015, x0032, x0064, x0066, respectively. Because the addresses of the six registers to be written to are not sequential, six separate transactions, each with a separate header, may be required under, for example, the I2C protocol.

If the processor 101 wishes to read the contents of a plurality of control registers 116 with non-sequential addresses, the I2C protocol may similarly require separate transactions for each disparately addressed control register 116 read.

With reference now to FIGS. 4 through 8, multiple embodiments that may allow for more efficient accessing (e.g., writing to and reading from) of the control registers 116 over data bus 105 will now be described. The embodiments described below may provide more efficient access by dynamically remapping the control register 116 addresses via one or more correlation circuits 118 such that reads and writes of the control registers 116 over the data bus 105 are "virtually" sequential, as explained in more detail below.

Figure 4:
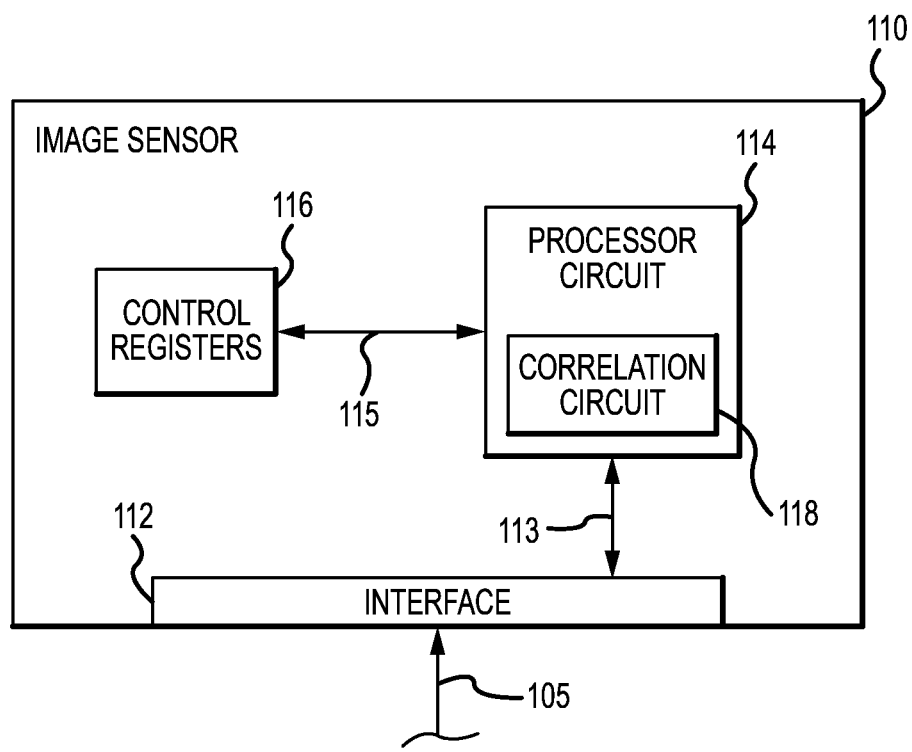
FIG. 4 is a block diagram of a first embodiment of an image sensor with a correlation circuit.

In FIG. 4, one embodiment of an image sensor 110 with control registers 116 and a correlation circuit 118 is shown. The image sensor 110 may include an interface 112, such as an input interface or an I/O interface, which may be coupled to and receive commands and/or data from data bus 105. The interface 105 may also receive a clock signal, and one or more other signals via other data lines or buses (not shown). The interface 105 may be coupled to an image sensor processor circuit 114 over a bus 113, which may in turn be coupled to a plurality of control registers 116 over a bus 115. The interface 105 may receive and/or transmit a plurality of portions of data read from or to be written to the plurality of control registers 116. Although not specifically illustrated in FIG. 2, the main processor circuit 101 of the electronic apparatus 100 may also include an interface, such as an I/O interface that similarly may receive and/or transmit a plurality of portions of data read from or to be written to the plurality of control registers 116, with the data bus 105 coupling the interface 112 of the image sensor 110 with the interface of the main processor circuit 101.

Returning to FIG. 4, the image sensor processor circuit 114 may control the operation of the image sensor 110, including receiving and processing commands and data from the main processor circuit 101, receiving, processing, and relaying image information from pixels of the image sensor 110 to the main processor circuit 101, and so forth. The image sensor processor circuit 114 may be a microprocessor, a state machine, control logic, or generally any suitable architecture.

The image sensor 110 may also include a correlation circuit 118, which may be configured to associate one or more respective portions of data with physical addresses of control registers 116 based on the respective position of the respective portions of data as received or transmitted by the interface 105. The correlation circuit 118 may be, for example, a translation table that includes a plurality of virtual addresses and a plurality of physical addresses. The translation table and/or the correlation circuit 118 may be a content addressable memory, wherein a virtual register address is presented as input to the correlation circuit and the physical address of the corresponding control register 116 may be output from the correlation circuit, which the processor circuit 114 may in turn use to access the relevant control register 116.

With reference to FIG. 4, the correlation circuit 118 may be a translation table defined in the image sensor processor circuit's 114 program or data memory. For example, an SRAM storage or data cache may be coupled to or provided internal to the processor circuit 114, and the SRAM or data cache may store the translation table mapping virtual addresses to physical addresses of the plurality of control registers 116.

Although not specifically illustrated in FIG. 2, the main processor circuit 101 may also include a separate but similar correlation circuit, which together with the main processor unit 101 may be configured to provide a plurality of portions of data to the image sensor 110 through the data bus 105. The correlation circuit in the main processor circuit 101 may operate to construct and deconstruct transactions for accessing multiple control registers 118 in a virtually sequential manner over the data bus 105, acting as a mirror to the correlation circuit 118 in the image sensor 110.

Figure 5:
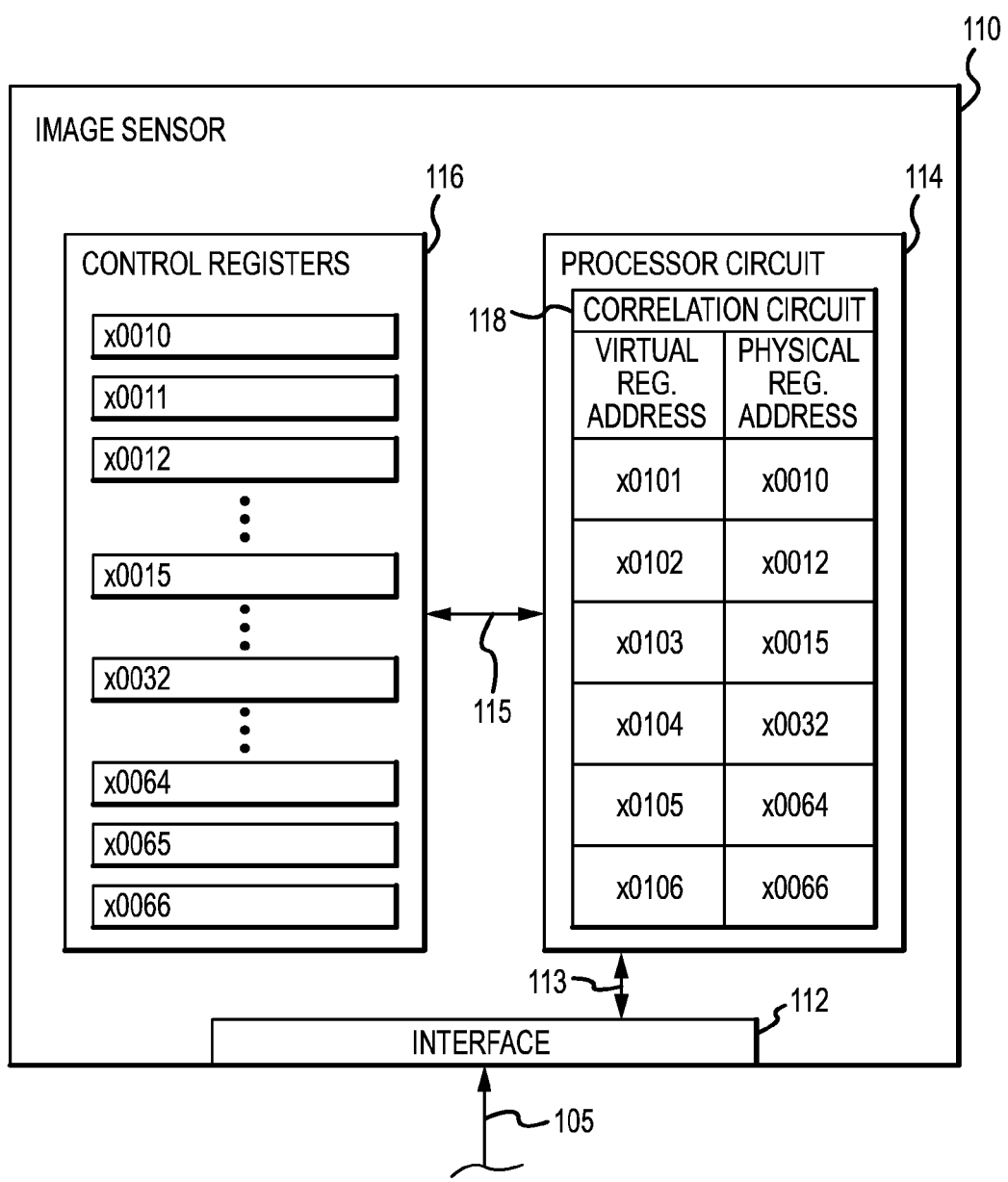
FIG. 5 is another block diagram of the first embodiment of an image sensor with a correlation circuit.

FIG. 5 illustrates a more detailed block diagram of one particular implementation of the first embodiment of an image sensor 110 from FIG. 4. In FIG. 5, a plurality of control registers 116 are illustrated by their relevant addresses. The control register block may include dozens, hundreds, thousands, or more individual control registers 116, with sequentially (e.g., consecutively) numbered addresses. In FIG. 5, only registers with addresses x0010, x0011, x0012, x0015, x0032, x0064, x0065, and x0066 are shown, with the omissions indicated by ellipses. In operation, the main processor circuit 101 may wish to access the control registers 116 in other than sequential order. For example, between integration times of frames, the main processor circuit 101 may wish to update registers with addresses x0010, x0012, x0015, x0032, x0064, and x0066, while leaving the registers with addresses x0011, x0013-0014, x0016-0031, x0033-0063, x0065, etc. as-is. Writing to targeted, disparate control registers 116 in this manner may be more efficient than writing to all of registers with addresses x0010 through x0066. Even though the six registers x0010, x0012, x0015, x0032, x0064, and x0066 do not have sequential addresses, the correlation circuit 118 shown in FIG. 5 allows for dynamic remapping of requests to write to those registers such that they are transmitted from the main processor circuit 101 to the image sensor 110 in a virtually sequential order, as explained below.

The correlation circuit 118 may be a translation table, with virtual register addresses corresponding with physical register addresses. As illustrated in FIG. 5, the correlation circuit 118 may associate physical register address x0010 with virtual register address x0101, physical register address x0012 with virtual register address x0102, physical register address x0015 with virtual register address x0103, physical register address x0032 with virtual register address x0104, physical register address x0064 with virtual register address x0105, and physical register address x0066 with virtual register address x0106.

Figure 6:
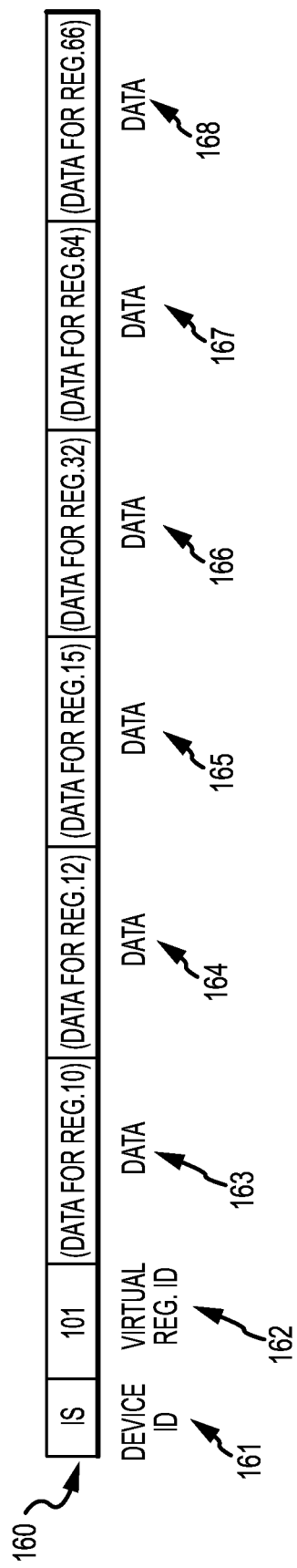
FIG. 6 is an illustration of a single write command sent to an image sensor over a data bus.

Referring now to FIG. 6 an illustration of one example of a write command sent to an image sensor 110 with a correlation circuit 118 over the data bus 105 is shown. In FIG. 6, similar to FIG. 3, six different portions of data are to be written to six non-sequentially addressed control registers 116 (specifically to registers x0010, x0012, x0015, x0032, x0064, and x0066). However, because the image sensor 110 includes the correlation circuit 118 described above with reference to FIG. 5, the main processor can send a single write transaction 160 with data for all six control registers 116. The single write transaction 160 includes a device ID field 161, a register ID field 162 (thus forming a single header), and six data fields 163, 164, 165, 166, 167, 168. Compared with FIG. 3, the single transaction 160 in FIG. 6 only requires that the device and register addresses (e.g., headers) be sent over the data bus 105, thus potentially reducing the amount of time required to transmit the single write command 160 in FIG. 6 as compared with the six separate write commands with six separate headers as illustrated in FIG. 3.

Referring now to FIGS. 2, and 4-6, in operation, sending a write command 160 from the main processor circuit 101 to the image sensor 110 may include one or more steps. For example, sending the write command 160 may involve the main processor circuit 101 and/or the image sensor circuit 110 preparing for the command 160 to be sent, the main processor circuit 101 sending the command 160, the image sensor 110 receiving the command 160, the image sensor 110 processing the received command 160, and the image sensor 110 writing the relevant control registers 116 according to the command 160.

To begin, the main processor circuit 101 may provide a translation table to be used in the correlation circuit 118 of the image sensor 110 to the image sensor 110, with the translation table including a mapping of virtual register addresses to physical control register addresses. The main processor circuit 101 may provide this to the image sensor 110 before some or all of the plurality of portions of data are transmitted over the data bus 105. The translation table provided from the main processor circuit 101 may be designed after considering which control registers 116 in the image sensor 110 will likely need to be updated on a regular basis. For example, during operation of the image sensor 110, control registers 116 that control the white balance adjustment of the image sensor 110 may need to be updated in between each frame of the image sensor 110. Because relatively little time is available to transmit updates and update those control registers 116 in between frames, reducing the amount of time required to transmit the updates may allow for faster frame rates, or may allow for other things to be transmitted on the data bus 105 in between frames. Therefore, a translation table similar to that shown in the correlation circuit 118 in FIG. 5 may be constructed by the main processor circuit 101 and transmitted to the image sensor 110 over the data bus 105. This translation table assigns a virtual register address to each of the physical registers 116 that will likely need to be updated during a transaction. The virtual addresses are made to be sequential, even though the addresses of the physical registers are disparate and not necessarily sequential. Once the translation table is constructed by the main processor circuit 101, it is transmitted to the image sensor 110, for example it may be transmitted over the data bus 105. Although in some embodiments, the translation table may be constructed and transmitted to the image sensor 110 during operation of the electronic apparatus 100 (and, may further be updated from time to time during operation of the image sensor 110), whereas in other embodiments, the translation table may be determined beforehand, such as when the electronic apparatus is manufactured, in which case the translation table may be hardwired into the image sensor 110 and not transferred over the data bus 105.

After the translation table has been sent or is made available in the image sensor 110, the main processor circuit 101 may provide the transaction 160 with the data to be written to the control registers 116 over the data bus 105 (for example, the transaction 160 may be provided to the data bus 105 in between integration frames of the image sensor 110). The main processor may also in some instances provide a virtual starting address 162 as part of the header of the transaction 160, which is subsequently received by the interface 112 of the image sensor 110. In other words, in some examples, and as illustrated in FIG. 6, the virtual register ID 162 that is sent in the transaction may act as a starting address for the virtually renumbered control registers. In other embodiments, however, no starting address may be sent, and instead, a flag may be set that indicates that the data in that transaction should be received and processed according to the correlation circuit 118 in the image sensor 110. In some examples, no flag or starting address may be required, and instead the image sensor 110 may be configured such that any write transaction automatically uses the translation table of the correlation circuit 118 to obtain destination addresses of the physical control registers 116 that are to be updated with the data contents of the transaction 160.

As the main processor circuit 101 provides the write transaction 160 to the data bus 105, the image sensor 110 receives the transaction 160, including the device ID field 161, the virtual register ID field 162, and the plurality of portions of data 163, 164, 165, 166, 167, 168. The image sensor 110 may serially receive the plurality of portions of data 163, 164, 165, 166, 167, 168 as a group, and may associate each respective portion of received data 163, 164, 165, 166, 167, 168. with a respective physical address of the plurality of control registers 116 based on respective positions of respective portions of data within the group as received by the interface 105 of the image sensor 110. The images sensor 110 may associate the received data with the physical addresses by referencing the correlation circuit 118 and the translation table stored therein in some examples, as described above.

More specifically, as just one example, the correlation circuit may associate a first of the plurality of portions of data (e.g., data for register x0010) with a first physical address (e.g., x0010) corresponding to the virtual starting address (e.g., x0101), and a second of the plurality of portions of data (e.g., data for register x0012) with a second physical address (e.g., x0012) corresponding to a second virtual address (e.g., x0102), the second virtual address being one greater than the virtual starting address, the second physical address (e.g., x0012) being unrelated to the first physical address (x0010), and the second portion of data immediately following the first portion of data in the plurality as received by the input interface. In this manner, the correlation circuit may help dynamically remap the plurality of portions of data (and possibly the virtual register addresses) to the physical control registers 116. In other words, the image sensor 110 may intercept the transmitted virtual address(es) in the write transaction 160, and translate the virtual addresses into the control registers' 116 true physical addresses, with the virtual addresses for all of the portions of data after the first portion being derived from the virtual starting address and the respective position of the portion of data in the transaction 160 (e.g., the second portion of data has a virtual address one greater than the starting virtual address, the third portion of data has a virtual address two greater than the starting virtual address, and so forth).

Once the image sensor 110 has received the transaction 160 and translated the received virtual register addresses into physical addresses for the control registers 116, the image sensor (e.g., through the image sensor processor circuit 114) may write the received portions of data into the control registers 116. In some examples, this may be done dynamically, e.g., as the plurality of portions of data are associated with physical addresses, the respective portions of data are nearly contemporaneously written to the respective control registers based on the associated, respective physical addresses, whereas in other examples, the image sensor 110 buffers or queues the plurality of portions of data and writes them to their respective control registers 116 after all of the plurality of portions of data are received and their virtual addresses translated. With reference to FIG. 4, the image sensor processor circuit 114 may write the portions of data in the relevant control registers 116 based on the associated, respective physical addresses as determined by the correlation circuit 118 dynamically as the portions of data are received.

Referring still to FIGS. 2, and 4-6, in operation, sending a read command from the main processor circuit 101 to the image sensor 110 may also include one or more steps. For example, sending a read command may involve the main processor circuit 101 and/or the image sensor circuit 110 preparing for the command to be sent, the main processor circuit 101 sending the command, the image sensor 110 receiving the command, the image sensor 110 processing the received command, the image sensor 110 reading the relevant control registers 116 according to the command 160, the image sensor 110 sending the data read from the control registers 116 back to the main processor circuit 101 over the data bus 105, the main processor circuit 101 receiving the read data, and the main processor circuit 101 processing the read data.

In general, a read transaction may be similar to a write transaction 160, except in reverse. For example, the main processor circuit 101 may request a certain number of registers beginning with a virtual starting address—e.g., the read command may include a device ID, a virtual starting register ID, and a number of registers to read. The image sensor 110 may receive the read command, may consult the correlation circuit 118 to determine which physical control registers 116 to read, and then the image sensor 110 may assemble those registers in sequential order to be transmitted back to the main processor circuit 101 without a header with specific register addresses for every portion of data. Upon receipt of the read data, a correlation circuit in the main processor circuit 101 may associate the received plurality of portions of data with the respective physical addresses of the control registers 116 from which the data was read based on the respective position of the portions of data in the plurality received at the main processor circuit 101.

Figure 7:
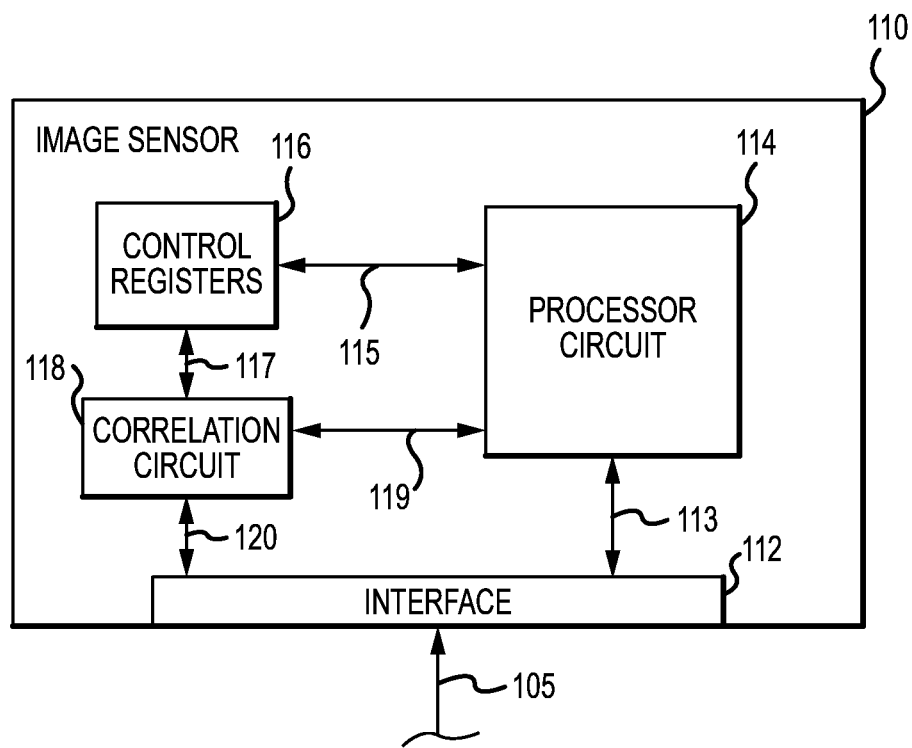
FIG. 7 is a block diagram of a second embodiment of an image sensor with a correlation circuit.

FIG. 7 is a block diagram of a second embodiment of an image sensor 110 with a correlation circuit 118. The image sensor 110 illustrated in FIG. 7 may be substantially similar in structure and operation to that illustrated in FIG. 4, except that the correlation circuit 118 in the image sensor 110 in FIG. 7 is not contained within the processor circuit 114 of the image sensor 110. Instead, the correlation circuit 118 is implemented in, for example, synthesized logic or custom memory cells that are instantiated on the image sensor 110. The correlation circuit 118 in FIG. 7 may in some examples be directly coupled to the interface 105 through bus 120 and may also be directly coupled to the control registers 116 through bus 117 in addition to being coupled to the processor circuit 114 through bus 119.

Figure 8:
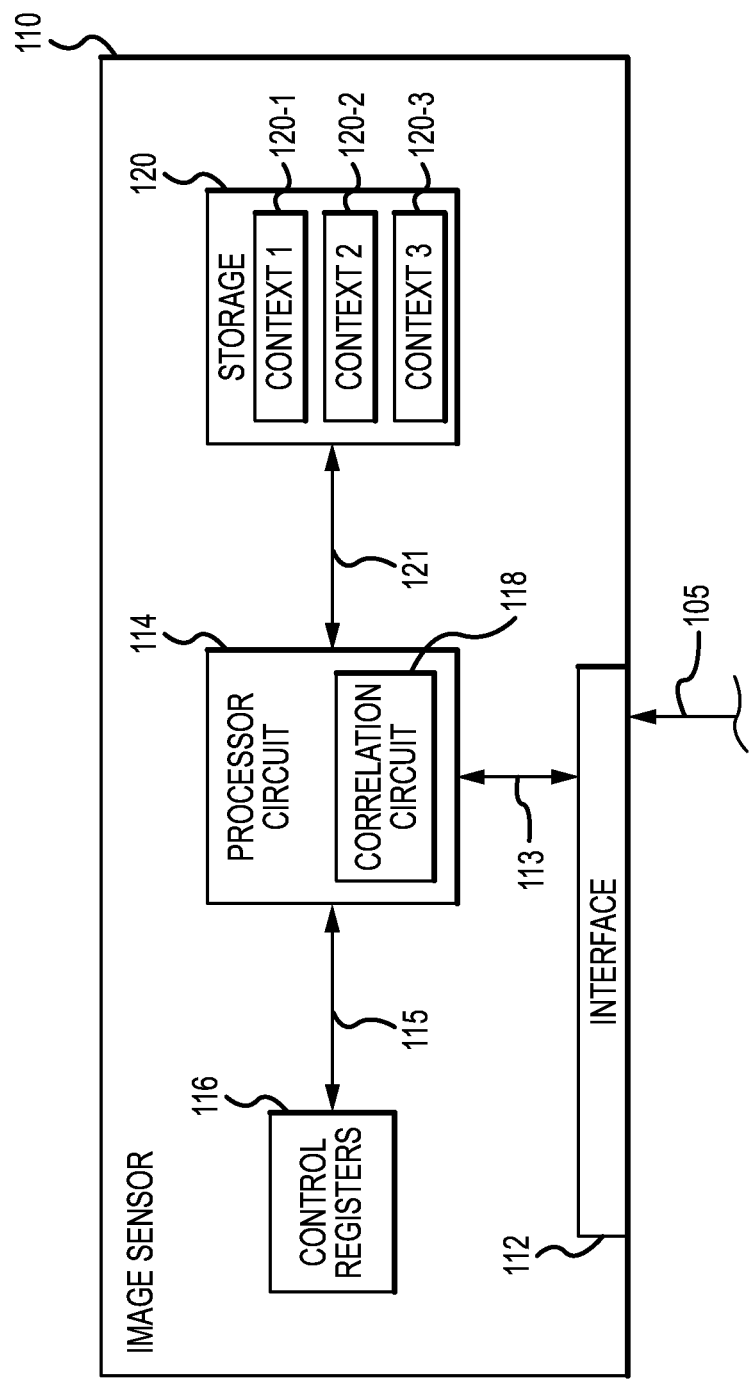
FIG. 8 is a block diagram of a third embodiment of an image sensor with a correlation circuit.

FIG. 8 is a block diagram of a third embodiment of an image sensor 110 with a correlation circuit 118. The image sensor 110 illustrated in FIG. 8 may be substantially similar in structure and operation to those illustrated in FIGS. 4 and 7, except that a storage circuit 120 is coupled to the image sensor processor circuit 114 in FIG. 8. The storage circuit 120 may be configured to store a plurality of contexts 120-1, 120-2, 120-3. Each context 120-1, 120-2, 120-3 may include a translation table specific to the respective context, which may include a mapping of virtual register addresses to the respective physical addresses of the control registers 116 that can be used by the correlation circuit 118 to dynamically remap received read and/or write requests received in the image sensor 110. The storage circuit 120 may be a memory array, a solid state storage circuit, or generally any type of data storage circuit.

In general, the translation tables may be stored in the contexts 120-1, 120-2, 120-3 in one of several different manners. For example, the image sensor 110 may populate the translation tables in contexts 120-1, 120-2, 120-3 during initialization of the image sensor, during operation of the image sensor, or, in other embodiments, translation tables in contexts 120-1, 120-2, 120-3 may be hardwired in the storage circuit 120 during manufacture.

The translation tables stored in the storage circuit 120 may be useful during context switches of the image sensor 110. Context switches may include, for example, changing from a preview (e.g., video) mode to a high-resolution still shot mode, changing to a different video frame rate, changing to a different resolution, changing to a different shutter speed or aperture, etc. Storing several translation tables may be useful because, depending on which context the image sensor 110 is operating under, different control registers 116 may require updating.

In operation, if multiple contexts 120-1, 120-2, 120-3 are stored in the storage circuit 120, upon a context switch of the image sensor 110, the appropriate translation table for the new context may not necessarily need to be transmitted over the data bus 105, but instead may be quickly moved from the storage circuit 120 to the correlation circuit 118 and ready for operation.

CONCLUSION

The foregoing description has broad application. For example, while examples disclosed herein may focus on image sensors, it should be appreciated that the concepts disclosed herein may equally apply to substantially any other type of device controlled over a data bus. Moreover, although control registers have primarily been described as one architecture allowing control over a device, it will be understood that other control mechanisms are also within the scope of this disclosure and the appended claims. Accordingly, the discussion of any embodiment is meant only to be exemplary and is not intended to suggest that the scope of the disclosure, including the claims, is limited to these examples.

What is claimed is:

1. An electronic apparatus, comprising:
   a controlled device with a plurality of control registers;
   a data bus coupled between the controlled device and a processor;
   an interface configured to receive a plurality of portions of data read from or to be written to respective control registers in the plurality of control registers; and
   a correlation circuit configured to:
      associate at least two portions of data in the plurality of portions of data with respective sequential virtual register addresses based on positions of the at least two portions of data within the plurality of portions of data; and
      associate the sequential virtual register addresses to respective non-sequential physical addresses of the respective control registers.

2. The electronic apparatus of claim 1, wherein the controlled device is one of an image sensor, a flash circuit, and a display.

3. The electronic apparatus of claim 1, wherein the controlled device comprises the interface and the correlation circuit, and the at least two portions of data are written to at least one control register in the respective control registers.

4. The electronic apparatus of claim 3, wherein the controlled device is an image sensor and the data bus is operable to provide the plurality of portions of data to the image sensor in between integration times of individual frames of the image sensor.

5. The electronic apparatus of claim 3, wherein the controlled device further comprises a context storage configured to store a plurality of contexts, with at least some of the plurality of contexts including a translation table, each translation table being specific to the respective context and including a mapping of the sequential virtual register addresses to the respective non-sequential physical addresses of the plurality of control registers.

6. The electronic apparatus of claim 3, wherein the correlation circuit comprises synthesized logic instantiated on the controlled device.

7. The electronic apparatus of claim 3, wherein the correlation circuit is a first correlation circuit, the processor comprises a second correlation circuit, and the processor and the second correlation circuit are configured to provide the plurality of portions of data to the controlled device through the data bus.

8. The electronic apparatus of claim 1, wherein the correlation circuit is a first correlation circuit, the controlled device includes the first correlation circuit, the plurality of portions of data are read from the plurality of control registers, the processor receives the plurality of portions of data read from the plurality of control registers, and the processor comprises the interface and a second correlation circuit configured to associate the at least two portions of data with respective virtual register addresses based on respective positions of the at least two portions of data within the plurality of portions of data.

9. An image sensor, comprising:
a plurality of control registers;
an input interface configured to receive a plurality of portions of data to be written to the plurality of control registers; and
a correlation circuit configured to associate at least two portions of data with a respective physical address of one of the plurality of control registers based on a position of the at least two portions of data within the plurality of portions of data, the correlation circuit configured to associate a first portion of data with a first physical address corresponding to a starting virtual address and a second portion of data with a second physical address corresponding to a second virtual address, the starting and second virtual addresses being sequential and the first and second physical addresses being non-sequential.

10. The image sensor of claim 9, wherein the correlation circuit is further configured to associate the at least two portions of data with the respective physical address based on a content-addressable memory.

11. The image sensor of claim 10, wherein the input interface is further configured to receive the starting virtual address along with the plurality of portions of data.

12. The image sensor of claim 11, wherein the second portion of data immediately follows the first portion of data in the plurality of portions of data as received by the input interface.

13. The image sensor of claim 9, further comprising a processor coupled to the image sensor and configured to provide the plurality of portions of data to the image sensor through a serial data bus.

14. The image sensor of claim 9, wherein the at least two portions of data represents control information to be written to the one of the plurality of control registers.

15. The image sensor of claim 9, wherein the image sensor comprises an image sensor processor circuit coupled to the plurality of control registers, the image sensor also comprises an SRAM storage coupled to the image sensor processor circuit, and the SRAM storage is configured to store a translation table mapping the sequential starting and second virtual addresses to the non-sequential physical address of the plurality of control registers.

16. A method for accessing control registers, comprising:
receiving a plurality of portions of data to be written to a plurality of control registers, the plurality of portions of data received as a group;
associating respective portions of data with respective sequential virtual register addresses and respective non-sequential physical addresses of the plurality of control registers based on positions of the respective portions of data within the received group, each sequential virtual register address associated with a respective non-sequential physical address; and
writing respective portions of data to respective control registers based on respective physical addressees of the plurality of control registers.

17. The method of claim 16, further comprising receiving a translation table of the physical addresses before receiving the plurality of portions of data.

18. The method of claim 16, wherein said associating respective portions of data with respective sequential virtual register addresses and respective non-sequential physical addresses occurs dynamically as the plurality of portions of data are received.

19. The method of claim 16, wherein the respective portions of data are associated with respective physical addresses responsive to a stored translation table.

20. The method of claim 19, further comprising updating the stored translation table responsive to a context switch.

* * * * *